United States Patent
Kohno et al.

(10) Patent No.: US 10,886,099 B2
(45) Date of Patent: Jan. 5, 2021

(54) METHOD OF ABERRATION MEASUREMENT AND ELECTRON MICROSCOPE

(71) Applicant: JEOL Ltd., Tokyo (JP)

(72) Inventors: Yuji Kohno, Tokyo (JP); Akiho Nakamura, Tokyo (JP)

(73) Assignee: JEOL Ltd., Tokyo (JP)

( * ) Notice: Subject to any disclaimer, the term of this patent is extended or adjusted under 35 U.S.C. 154(b) by 0 days.

(21) Appl. No.: 16/282,897

(22) Filed: Feb. 22, 2019

(65) Prior Publication Data
US 2019/0267210 A1 Aug. 29, 2019

(30) Foreign Application Priority Data

Feb. 23, 2018 (JP) .................. 2018-030713

(51) Int. Cl.
| | | |
|---|---|---|
| *H01J 37/00* | (2006.01) | |
| *H01J 37/22* | (2006.01) | |
| *H01J 37/28* | (2006.01) | |
| *H01J 37/26* | (2006.01) | |
| *H01J 37/153* | (2006.01) | |

(52) U.S. Cl.
CPC .......... *H01J 37/226* (2013.01); *H01J 37/153* (2013.01); *H01J 37/26* (2013.01); *H01J 37/28* (2013.01); *H01J 2237/1532* (2013.01); *H01J 2237/1534* (2013.01); *H01J 2237/282* (2013.01); *H01J 2237/2802* (2013.01); *H01J 2237/2809* (2013.01)

(58) Field of Classification Search
USPC ....................................................... 250/307
See application file for complete search history.

(56) References Cited

U.S. PATENT DOCUMENTS

| | | | | |
|---|---|---|---|---|
| 6,759,656 B2* | 7/2004 | Tomita | ................. | H01J 37/26 250/311 |
| 6,924,488 B2* | 8/2005 | Matsuya | ............... | H01J 37/153 250/311 |
| 7,064,326 B2* | 6/2006 | Furukawa | ............... | H01J 37/22 250/311 |
| 7,088,426 B2* | 8/2006 | Hirukawa | ........... | G03F 7/70258 355/53 |
| 7,705,300 B2* | 4/2010 | Morokuma | ............. | H01J 37/21 250/310 |
| 8,581,190 B2* | 11/2013 | Nakano | ................... | H01J 37/21 250/310 |
| 8,895,922 B2* | 11/2014 | Berney | ................. | H01J 37/073 250/307 |
| 9,552,961 B2* | 1/2017 | Tromp | ................. | H01J 37/244 |
| 10,241,062 B2* | 3/2019 | Ominami | ........... | G01N 23/2204 |

FOREIGN PATENT DOCUMENTS

JP 200455143 A 2/2004

* cited by examiner

*Primary Examiner* — Phillip A Johnston
(74) *Attorney, Agent, or Firm* — The Webb Law Firm

(57) ABSTRACT

There is provided a method of aberration measurement capable of reducing the effects of image drift. The novel method of aberration measurement is for use in an electron microscope. The method comprises the steps of: acquiring a first image that is a TEM (transmission electron microscope) image of a sample; scanning the illumination angle of an electron beam impinging on the sample and acquiring a second image by multiple exposure of a plurality of TEM images generated at different illumination angles; and calculating aberrations from the first and second images.

7 Claims, 12 Drawing Sheets

METHOD OF ABERRATION MEASUREMENT AND ELECTRON MICROSCOPE

CROSS-REFERENCE TO RELATED APPLICATION

This application claims priority to Japanese Patent Application No. 2018-030713 filed Feb. 23, 2018, the disclosure of which is hereby incorporated by reference in its entirety.

BACKGROUND OF THE INVENTION

Field of the Invention

The present invention relates to a method of aberration measurement and electron microscope.

Description of Related Art

In transmission electron microscopy (TEM), aberration correction is an important technique for high-resolution imaging.

A method of measuring aberrations (defocus) from TEM images generated before and after tilting of an electron beam incident on a sample is disclosed as a method of aberration measurement, for example, in JP-A-2004-55143.

FIGS. 14-16 illustrate the prior art method of aberration measurement. In these FIGS. 14-16, for the sake of convenience, there are shown only deflectors 102, an imaging lens system 104, and an imager (CCD camera) 108.

In the prior art method of aberration measurement, a sample S is first irradiated with an electron beam EB such that the beam is made to impinge on the sample at a first illumination angle by the illumination deflectors 102 as shown in FIG. 14, and a TEM image is taken. Then, as shown in FIG. 15, the illumination angle of the electron beam EB is varied from the first illumination angle to a second illumination angle by the deflectors 102, and a TEM image is taken. Subsequently, as shown in FIG. 16, the illumination angle of the electron beam EB is varied from the second illumination angle to a third illumination angle by the deflectors 102, and a TEM image is taken. In this way, plural TEM images are taken at different illumination angles. The illumination angles and the number of the taken TEM images are set appropriately according to the types of aberrations under measurement.

Then, aberrations are measured from the obtained plural TEM images by a diffractogram tableau method or an image shifting technique. FIG. 17 illustrates a diffractogram tableau. In the diffractogram tableau, Fourier-transformed patterns (diffractograms) of TEM images of an amorphous sample are arranged according to the illumination angle (i.e., tilt angle and azimuthal angle). Where aberrations are measured using a diffractogram tableau, defocus and astigmatism are computed by Fourier transform of the TEM images of the amorphous sample. The aberrations in the imaging system can be found from combinations of calculated values of defocus and astigmatism.

FIG. 18 illustrates an example of measurement of aberrations using image shift. There are shown two TEM images obtained at different angles of illumination of the electron beam EB. Where image shifting is used, relative positional deviations between the obtained TEM images are computed, and then aberrations in the imaging system are computed from combinations of electron beam illumination angles and image shift values.

Whether a diffractogram tableau or image shift is used, it is necessary to obtain multiple TEM images. Especially, where higher order aberrations are measured, it is needed to acquire a greater number of TEM images, thus prolonging the time taken to acquire the required number of TEM images for aberration measurement.

Because it takes a long time to acquire a large number of TEM images, relative positional deviations (sample drifts) among the TEM images caused by movement of the sample, i.e., image drifts, are increased. Such image drifts affect measurements of aberrations using image shifting and therefore, if large image drifts occur, the accuracy at which aberrations are measured is deteriorated greatly.

SUMMARY OF THE INVENTION

In view of the foregoing problem, the present invention has been made. One object associated with some aspects of the present invention is to provide a method of aberration measurement capable of reducing the effects of image drift. Another object associated with some aspects of the invention is to provide an electron microscope capable of measuring aberrations in such a way that the effects of image drift can be reduced.

A method of aberration measurement associated with the present invention is for use in an electron microscope and starts with acquiring a first image that is a TEM (transmission electron microscope) image of a sample. The illumination angle of an electron beam impinging on the sample is scanned to generate a plurality of TEM images at different values of the illumination angle. A second image is acquired by multiple exposure of the TEM images. Aberrations are calculated from the first and second images.

In this method of aberration measurement, the illumination angle of the electron beam impinging on the sample is scanned, and the second image is acquired by multiple exposure of the plural TEM images generated at different values of the illumination angle. Therefore, the TEM images generated at different values of the illumination angle can be derived in a short time. Hence, during aberration measurement, the effects of image drift can be reduced.

An electron microscope associated with the present invention comprises:
an electron source for emitting an electron beam;
an illumination system including deflectors for deflecting the emitted electron beam;
an imaging system for generating a focused TEM image from electrons transmitted through a sample;
an imager for capturing the TEM image generated by the imaging system; and
an aberration measuring section for measuring aberrations in the imaging system.

The aberration measuring section performs the steps of: acquiring a first image that is a TEM image of the sample; controlling the deflectors to scan the illumination angle of the electron beam impinging on the sample such that a second image is acquired by multiple exposure of a plurality of TEM images generated at different values of the illumination angle; and calculating the aberrations from the first and second images.

In this electron microscope, the deflectors are so controlled that the illumination angle of the electron beam hitting the sample is scanned. The plurality of TEM images are generated at different angles of illumination and subjected to a multiple exposure process, thus resulting in the second image. Consequently, the plural TEM images generated at different angles of illumination can be obtained in a short time. As a result, during aberration measurement, the effects of image drift can be reduced.

DESCRIPTION OF THE INVENTION

The preferred embodiments of the present invention are hereinafter described in detail with reference to the drawings. It is to be understood that the embodiments provided below do not unduly restrict the scope and content of the present invention delineated by the appended claims and that not all the configurations described below are essential constituent components of the invention.

1. Electron Microscope

Figure 1:
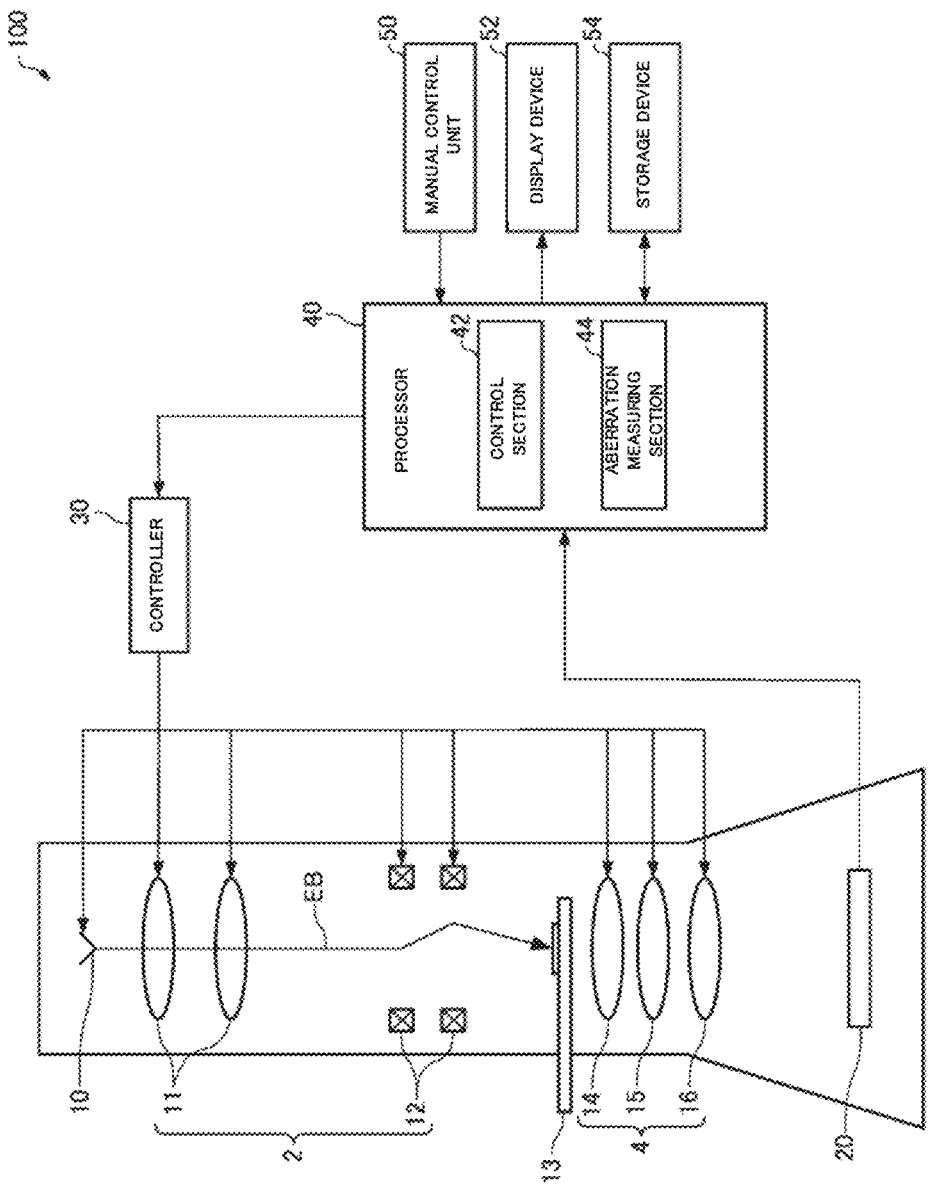
FIG. 1 is a diagram illustrating the configuration of an electron microscope associated with a first embodiment of the present invention.

An electron microscope associated with one embodiment of the present invention is first described by referring to FIG. 1, which shows the configuration of this electron microscope, 100, associated with the present embodiment.

As shown in FIG. 1, the electron microscope 100 includes an electron source 10, an illumination lens system 11, deflectors 12, a sample stage 13, an objective lens 14, an intermediate lens 15, a projector lens 16, an imager 20, a controller 30, a processor 40, a manual control unit 50, a display device 52, and a data storage section 54.

The electron source 10 generates an electron beam EB. For example, the electron source 10 is an electron gun that emits the electron beam EB by accelerating electrons released from a cathode by means of an anode.

The electron beam EB generated from the electron source 10 is focused onto a sample S by the illumination lens system 11. In the illustrated example, the illumination lens system 11 is made up of two electron lenses. Alternatively, the illumination lens system 11 may be made up of more than two electron lenses.

The electron beam EB focused by the illumination lens system 11 is deflected in two dimensions by the deflectors 12 and thus the angle of illumination of the electron beam EB impinging on the sample S can be controlled. The illumination angle of the electron beam EB is the angle at which the electron beam EB illuminates the sample S. The illumination angle of the electron beam EB is represented in terms of both the tilt angle A of the electron beam EB relative to the optical axis L and the azimuthal angle B of the electron beam EB (see FIG. 8 referenced below).

The illumination lens system 11 and the deflectors 12 together constitute the illumination system 2 of the electron microscope 100. Note that the illumination system 2 may be provided with electron lenses other than the illumination lens system 11 and deflectors 12. Furthermore, the illumination system 2 may have other deflectors, an aperture, and other components.

The sample stage 13 holds the sample S. The sample stage 13 may hold the sample S via a sample holder. The sample stage 13 can move the sample S horizontally and vertically and tilt the sample S.

The objective lens 14 is an initial stage of lens for forming a focused transmission electron microscope (TEM) image from electrons transmitted through the sample S. The image created by the objective lens 14 is further magnified by the intermediate lens 15 and projector lens 16 and focused onto the imager 20.

The objective lens 14, intermediate lens 15, and projector lens 16 together constitute the imaging system 4 of the electron microscope 100. The imaging system 4 may be equipped with electron lenses other than the objective lens 14, intermediate lens 15, and projector lens 16. In addition, the imaging system 4 may have deflectors, an aperture, and other components.

The imager 20 captures the TEM image focused by the imaging system 4. For example, the imager 20 is a digital camera such as a CCD (charge coupled device) camera.

The controller 30 operates the electron source 10, illumination system 2, sample stage 13, imaging system 4, and other components on the basis of control signals from a control section 42 and from an aberration measuring section 44.

The manual control unit 50 acquires a control signal responsive to a user's manipulation and sends the signal to the processor 40. The manual control unit 50 is made of buttons, keys, a touch-panel display, a microphone, or the like.

The display device 52 displays the image created by the processor 40. The function of the display device 52 can be implemented by a liquid crystal display (LCD) or the like.

The data storage section 54 stores programs, data, and related information permitting the processor 40 to perform various computational operations and control operations. The data storage section 54 is used as a working area for the processor 40. That is, the data storage section 54 is used to temporarily store the results of calculations performed by the processor 40 in accordance with various programs. The function of the data storage section 54 can be realized by a ROM (read only memory), a RAM (random access memory), or other storage device.

The processor 40 performs various control operations and computational operations according to programs stored in the data storage section 54. The functions of the processor 40 can be realized by executing programs by means of various processors such as a CPU (central processing unit). At least some of the functions of the processor 40 may be realized by a dedicated circuit such as an ASIC (e.g., a gate array). The processor 40 includes the aforementioned control section 42 and aberration measuring section 44.

The control section 42 performs processing to generate control signals for controlling the illumination system 2, sample stage 13, imaging system 4, and other components. For example, the control section 42 generates control signals in response to a user's instruction issued via the manual control unit 50 and sends the signals to the controller 30.

The aberration measuring section 44 performs processing to measure aberrations in the imaging system 4. In particular, the aberration measuring section 44 performs a processing operation for acquiring a reference image (first image), a processing operation for acquiring a multiple exposure image (second image), and a processing operation for computing aberrations both from the reference image and from the multiple exposure image. Details of the processing performed by the aberration measuring section 44 will be described below in "3. Operation of Electron Microscope".

2. Method of Aberration Measurement

Figure 2:
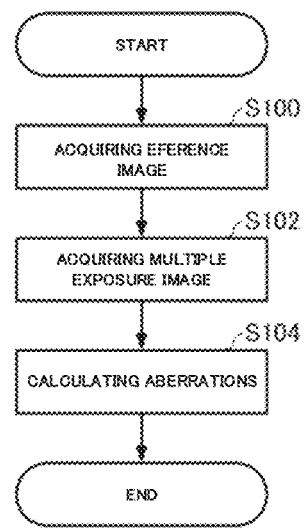
FIG. 2 is a flowchart illustrating one example of method of aberration measurement associated with the first embodiment.

A method of aberration measurement associated with the present embodiment is next described by referring to the flowchart of FIG. 2, which illustrates one example of the method of aberration measurement associated with the present embodiment.

(1) Acquisition of Reference Image (S100)

A TEM image (reference image) is first acquired under conditions where the electron beam EB is not deflected by the deflectors 12.

Figure 3:
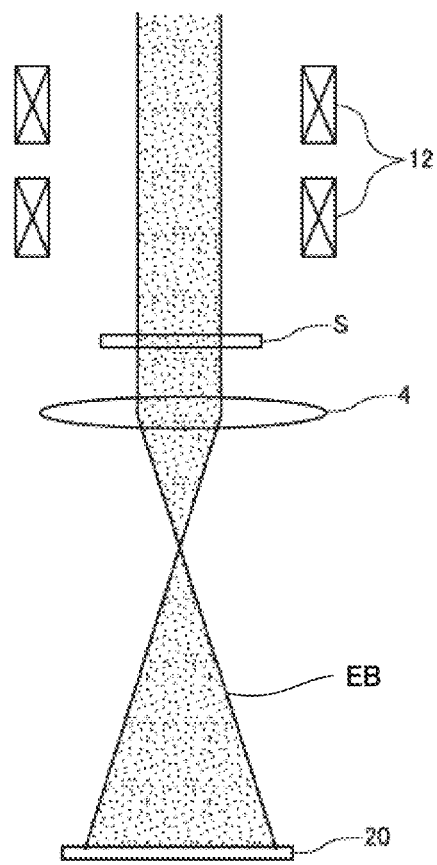
FIG. 3 is a schematic representation illustrating the manner in which an electron beam is made to impinge on a sample without deflecting the beam.
Figure 4:
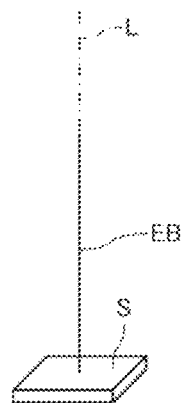
FIG. 4 is a schematic representation illustrating the manner in which an electron beam is made to impinge on a sample without deflecting the beam.

FIGS. 3 and 4 schematically illustrate the manner in which the electron beam EB is directed at the sample S while the electron beam EB is not deflected. In FIG. 3, for the sake of convenience, members other than the deflectors 12, imaging system 4, and imager 20 are omitted from being shown. In FIG. 3, the objective lens 14, intermediate lens 15, and projector lens 16 together constituting the imaging system 4 is shown as one lens.

Figure 5:
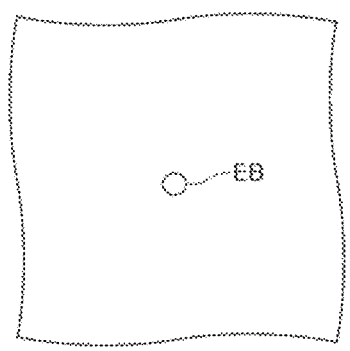
FIG. 5 is a schematic representation illustrating the distribution of illumination angles of an electron beam taken when a reference image is obtained.
Figure 6:
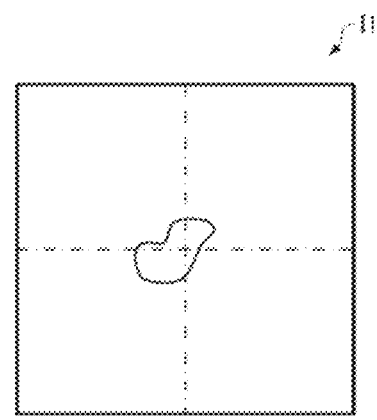
FIG. 6 is a pictorial representation of the reference image.

FIG. 5 is a schematic representation illustrating the distribution of illumination angles of the electron beam EB taken when the reference image is acquired. FIG. 6 is a pictorial representation of the TEM image (reference image I1) obtained under conditions where the electron beam EB is not deflected.

As shown in FIGS. 3-5, in a case where the electron beam EB is not deflected by the deflectors 12, the electron beam EB impinges on the sample S along the optical axis L. As a result, a TEM image (reference image I1) as shown in FIG. 6 is obtained.

The reference image is not restricted to the TEM image obtained under conditions where the electron beam EB is not deflected as long as the image serves as a basis (template) in the processing for calculating the cross-correlation with a multiple exposure image described later. That is, a TEM image generated at any arbitrary illumination angle of the electron beam EB may be used as the reference image.

(2) Acquition of Multiple Exposure Image (S102)

Then, a multiple exposure image is acquired by scanning the illumination angle of the electron beam EB by means of the deflectors 12 and subjecting a plurality of TEM images generated at different illumination angles to a multiple exposure process. That is, the plural TEM images are overlapped and captured. The multiple exposure image is a single image derived by overlapping and capturing the plural TEM images.

Figure 7:
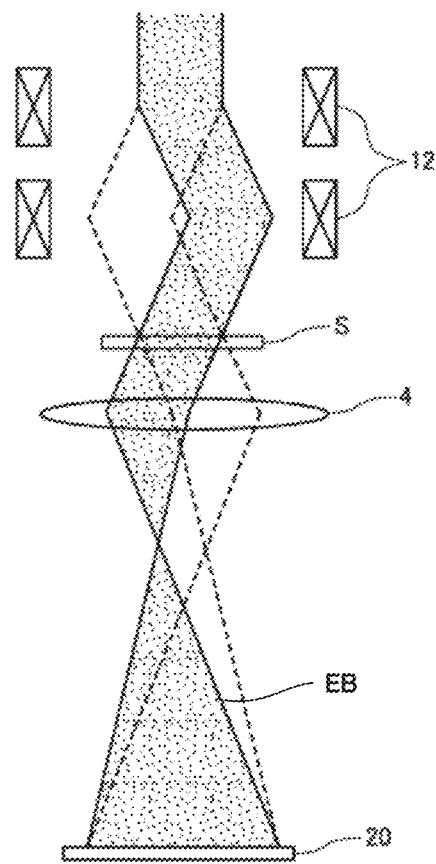
FIG. 7 is an electron ray diagram illustrating the manner in which the illumination angle of the electron beam is being scanned.
Figure 8:
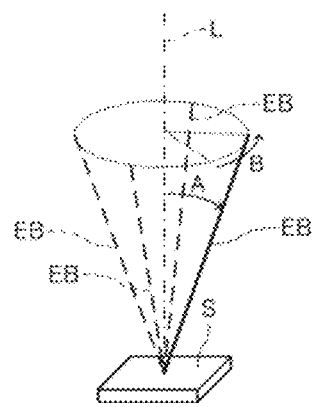
FIG. 8 is an electron ray diagram in perspective form illustrating the manner in which the illumination angle of the electron beam is being scanned.
Figure 9:
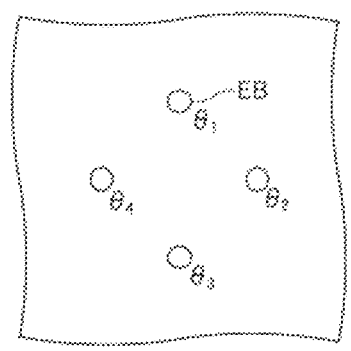
FIG. 9 is a pictorial representation illustrating the distribution of illumination angles of an electron beam taken when a multiple exposure image is obtained.
Figure 10:
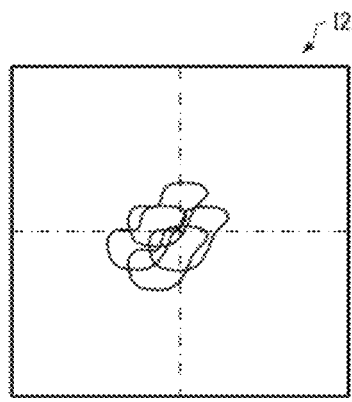
FIG. 10 is a pictorial representation of the multiple exposure image.

FIGS. 7 and 8 schematically illustrate the manner in which the illumination angle of the electron beam EB is being scanned. FIGS. 7 and 8 correspond to FIGS. 3 and 4, respectively. FIG. 9 is a pictorial representation illustrating the distribution of illumination angles of the electron beam EB taken when a multiple exposure image is acquired. FIG. 10 is a pictorial representation of the multiple exposure image I2.

When the illumination angle of the electron beam EB is varied, the TEM image shifts according to aberrations in the imaging system 4. Therefore, if the illumination angle of the electron beam EB is scanned under conditions, for instance, where there are aberrations in the imaging system 4 (e.g., the image is defocused), the multiple exposure image I2 is obtained in which shifted TEM images are overlapped as shown in FIG. 10. Because the amounts of shifts of the TEM images and the directions of the shifts are different according to the illumination angle, positional deviations occur among the TEM images in the multiple exposure image I2.

In the example shown in FIG. 9, scanning of the electron beam EB is done by scanning (varying) the illumination angle from a first angle $\theta_1$ to a fourth angle $\theta_4$ through a second angle $\theta_2$ and a third angle $\theta_3$, i.e., in the order $\theta_1$-$\theta_2$-$\theta_3$-$\theta_4$, and repeating this process. As a result, there is obtained the multiple exposure image I2 having the overlapped TEM images respectively generated at the first illumination angle $\theta_1$, second illumination angle $\theta_2$, third illumination angle $\theta_3$, and fourth illumination angle $\theta_4$.

For example, the electron beam EB is shot 3,000 times at the sample S while varying the illumination angle from the first illumination angle $\theta_1$ to the fourth illumination angle $\theta_4$ such that each shot persists for 100 μs. At this time, the TEM image is exposed at each illumination angle for 0.3 second. In this case, the exposure time needed to obtain the multiple exposure image I2 is 1.2 seconds (0.3 second×4). That is, the multiple exposure image I2 is an overlap of four TEM images each of which is generated with an exposure time of 0.3 second.

The effects of image drift during aberration measurement can be reduced by performing the scanning of the illumination angle while repetitively varying the illumination angle in the order $\theta_1$-$\theta_2$-$\theta_3$-$\theta_4$ from $\theta_1$, wherein $\theta_1$ is the first illumination angle, $\theta_2$ is the second illumination angle, $\theta_3$ is the third illumination angle, and $\theta_4$ is the fourth illumination angle.

For example, where the illumination angle is scanned from the first illumination angle $\theta_1$ to the fourth illumination angle $\theta_4$ with a shot period of 0.3 second, it takes a time of at least 0.3 second from the beginning of capturing of the TEM image generated at the first illumination angle $\theta_1$ to the beginning of capturing of the TEM image generated at the next illumination angle $\theta_2$.

On the other hand, where 3,000 shots, each persisting for 100 μs, are taken while scanning the illumination angle from the first angle $\theta_1$ to the fourth angle $\theta_4$ in a repetitive manner, it takes only 100 μs from the beginning of capturing of the TEM image generated at the first illumination angle $\theta_1$ to the beginning of capturing of the TEM image generated at the next illumination angle $\theta_2$. Consequently, image drift can be suppressed.

When the sample S is illuminated multiple times at from the first illumination angle $\theta_1$ to the fourth illumination angle $\theta_4$, if the sample S drifts and an image drift occurs, TEM images generated at the first illumination angle $\theta_1$, second illumination angle $\theta_2$, third illumination angle $\theta_3$, and fourth illumination angle $\theta_4$, respectively, in the multiple exposure image I2 become blurred. In spite of this phenomenon, the relative positional relationship among four peaks corresponding to these four TEM images (i.e., the four illumination angles) hardly varies, the positional relationship being represented by a correlation function computed both from the reference image I1 and from the multiple exposure image I2 if the four TEM images are blurred due to image drift. Hence, the blurs in the TEM images affect aberration measurements only slightly.

Accordingly, the effects of image drift on aberration measurements can be reduced by varying the illumination angle from the first angle $\theta_1$ to the fourth angle $\theta_4$ and repeating this process.

In the foregoing description, the multiple exposure image I2 is acquired after acquisition of the reference image I1. Alternatively, the reference image I1 may be acquired after acquisition of the multiple exposure image I2.

Furthermore, in the foregoing example, the multiple exposure image I2 does not contain the reference image I1. Alternatively, the multiple exposure image I2 may contain the reference image I1.

(3) Calculation of Aberrations (S104)

Then, a correlation function is calculated both from the reference image I1 and from the multiple exposure image I2, and aberrations in the imaging system 4 are calculated.

Figure 11:
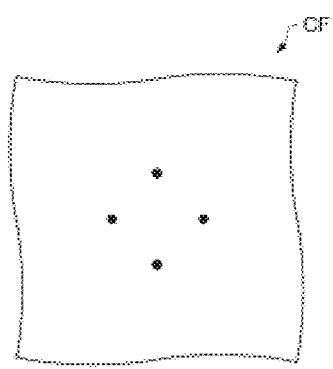
FIG. 11 is a pictorial representation illustrating a correlation function calculated both from the reference image and from the multiple exposure image.

FIG. 11 is a pictorial representation illustrating a correlation function CF calculated both from the reference image I1 and from the multiple exposure image I2. It is seen from FIG. 11 that there are four peaks in the correlation function CF obtained from the reference image I1 and the multiple exposure image I2. The four peaks represent amounts of beam shifts corresponding to the four illumination angles (first angle $\theta_1$, second angle $\theta_2$, third angle $\theta_3$, and fourth angle $\theta_4$), respectively. Aberration coefficients can be calculated from the positions of the peaks present in the correlation function using a least squares method or other method.

In the foregoing description, the scanning of the illumination angle is carried out by varying the illumination angle from the first illumination angle $\theta_1$ to the fourth illumination angle $\theta_4$. No restriction is imposed on the number of increments n of the illumination angle (where n is an integer equal to or greater than 2) during scanning of the illumination angle. That is, the illumination angle may be scanned by varing the illumination angle from the first illumination angle $\theta_1$ to the nth illumination angle $\theta_n$. At this time, higher order aberrations can be measured by increasing the number of the increments n of the illumination angle.

In this way, in the method of aberration measurement associated with the present embodiment, the types of calculatable aberrations are restricted by the number of angular increments n, i.e., the number of TEM images subjected to a multiple exposure process. For example, any aberration coefficients that cannot be measured are assumed to be "0" or separately measured values are used. In the illustrated example, the number of TEM images n subjected to a multiple exposure process is 4, i.e., the number of angular increments n=4. With the correlation function CF illustrated in FIG. 11, aberrations can be separated only up to the second order. However, if the amount of spherical aberration is known, lower order aberrations can be calculated taking account of the effects of spherical aberration by performing calculations under the condition where higher order aberrations other than spherical aberrations are "0".

3. Operation of Electron Microscope

The operation of the electron microscope 100 is next described. With the electron microscope 100, aberrations in the imaging system 4 can be measured automatically. In the electron microscope 100, the aberration measuring section 44 performs the step (S100) of acquiring the reference image I1 shown in the above-cited FIG. 2, the step (S102) of acquiring the multiple exposure image I2, and the step (S104) of calculating aberrations both from the reference image I1 and from the multiple exposure image I2.

For example, if the user manipulates the manual control unit 50 to issue an instruction to start an aberration measurement, the aberration measuring section 44 performs processing to acquire the reference image I1. In particular, the aberration measuring section 44 generates a control signal to control the illumination system 2 including the deflectors 12 to inhibit the electron beam EB from being deflected, and sends the signal to the controller 30. As a result, the imager 20 acquires a TEM image (reference image I1). The aberration measuring section 44 acquires the reference image I1 captured by the imager 20.

Then, the aberration measuring section 44 controls the deflectors 12 to scan the illumination angle of the electron beam EB impinging on the sample S and acquires the multiple exposure image I2 by multiple exposure of plural TEM images generated at different illumination angles.

Information about the illumination angle used when the illumination angle is scanned is previously stored in the data storage section 54. The aberration measuring section 44 generates a control signal on the basis of the information about the illumination angle stored in the data storage section 54 and sends the signal to the controller 30. As a result, the illumination angle of the electron beam EB is scanned, and TEM images generated at different illumination angles are subjected to multiple exposure in the imager 20. The aberration measuring section 44 acquires the multiple exposure image I2 captured by the imager 20.

Then, the aberration measuring section 44 calculates aberrations in the imaging system 4 both from the reference image I1 and from the multiple exposure image I2. The aberrations can be measured by the processing described so far. In the electron microscope 100, the aberrations in the imaging system 4 can be corrected by operating an aberration corrector (not shown) based on the measured aberrations.

An example has been given in which the aberration measuring section 44 performs the step (S100) of acquiring the reference image I1 shown in the above cited FIG. 2, the step (S102) of acquiring the multiple exposure image I2, and the step (S104) of calculating aberrations. At least some of these processing steps may be done by the user. For example, the user may operate the electron microscope 100 via the manual control unit 50 to acquire both the reference image I1 and the multiple exposure image I2.

4. Features

The method of aberration measurement associated with the present embodiment has the following features. The method of aberration measurement associated with the present embodiment involves the steps of acquiring the reference image I1 that is a TEM image of the sample S, acquiring the multiple exposure image I2 by scanning the illumination angle of the electron beam EB impinging on the sample S and subjecting a plurality of TEM images generated at different illumination angles to a multiple exposure process, and measuring aberrations both from the reference image I1 and from the multiple exposure image I2.

Therefore, in the method of aberration measurement associated with the present embodiment, a plurality of TEM images generated at different illumination angles can be acquired in a short time and so the effects of image drift during aberration measurement can be reduced. As a result, aberrations can be measured with high accuracy.

In the present embodiment, in order to obtain a plurality of TEM images at different illumination angles, the electron beam EB must be deflected by the deflectors 12. The deflectors 12 can deflect the electron beam EB at quite high rates (e.g., in a time on the order of 1 μs to 10 μs). Accordingly, by scanning the illumination angle by means of the deflectors 12 and acquiring the multiple exposure image I2, plural TEM images generated at different illumination angles can be acquired in a short time.

In the method of aberration method associated with the present embodiment, aberrations are measured from plural TEM images generated at different illumination angles and, therefore, the method of aberration measurement associated with the present embodiment can be applied to wide samples.

In the method of aberration measurement associated with the present embodiment, during the step of acquiring the multiple exposure image I2, the illumination angle of the electron beam EB impinging on the sample S is scanned and varied from the first angle $\theta_1$ to the nth angle $\theta_n$ (where n is an integer equal to or greater than 2). This process is repeated and a plurality of TEM images are obtained. The TEM images are subjected to a multiple exposure process. Therefore, as described previously, the effects of image drift during aberration measurement can be reduced.

In the method of aberration measurement associated with the present embodiment, during the step of measuring aberrations, a correlation function is calculated both from the reference image I1 and from the multiple exposure image I2. Aberrations are measured from the positions of peaks appearing in the calculated correlation function. In the multiple exposure image I2, image drifts of TEM images generated at different illumination angles can be reduced. Therefore, the effects of image drifts during aberration measurement can be reduced.

In the electron microscope 100, the aberration measuring section 44 performs the steps of: acquiring the reference image I1; acquiring the multiple exposure image I2 consisting of TEM images generated at different illumination angles by controlling the deflectors 12 such that the illumination angle of the electron beam EB impinging on the sample S is scanned; and measuring aberrations both from the reference image I1 and from the multiple exposure image I2. Therefore, in the electron microscope 100, a plurality of TEM images generated at different illumination angles can be acquired in a short time. The effects of image drift during aberration measurement can be reduced. In consequence, aberrations can be measured with high accuracy.

5. Modified Embodiments

It is to be understood that the present invention is not restricted to the foregoing embodiments but rather they can be implemented in variously modified forms without departing from the gist of the present invention.

5.1. First Modified Embodiment

A first modified embodiment is first described. Where aberrations are calculated by calculating a correlation function both from the reference image I1 and from the multiple exposure image I2, it is necessary to know the correlative relationship of peaks to illumination angles. One method of knowing illumination angles corresponding to peaks is to vary the illumination angle. Another method is to vary aberrations.

For example, by carrying out the step (S102) of acquiring the multiple exposure image I2 a plurality of times while varying the amount of defocus, a plurality of multiple exposure images I2 having different amounts of defocus are obtained.

During the step (S104) of calculating aberrations, each correlation function between a respective one of the plurality of multiple exposure images I2 and the reference image I1 is calculated. The positions of the peaks of the correlation functions shift according to (in proportion to) the amount of defocus and the illumination angle. Utilizing this, illumination angles corresponding to their respective peaks can be found from the plural correlation functions.

In the first modified embodiment, a plurality of multiple exposure images I2 are acquired by carrying out the step of acquiring the multiple exposure image I2 while varying the amount of defocus. During the step of measuring aberrations, correlation functions of the multiple exposure images I2 with respect to the reference image I1 are calculated, and illumination angles corresponding to peaks are found from the calculated correlation functions. Therefore, according to the first modified embodiment, peaks of correlation functions and illumination angles can be easily made to correspond to each other.

5.2. Second Modified Embodiment

A second modified embodiment is next described. In the method of aberration measurement associated with the above-described embodiment, in a case where aberrations are very small, peaks of correlation functions overlap with each other and thus it is difficult to separate the peaks. In this case, the peaks may be separated by adding an appropriate given amount of aberration. The added aberration is preferably defocus which is easy to control and which results in uniform movement of peaks. By previously examining variations in astigmatism and comatic aberration accompanying defocus variations, aberrations left behind when the added defocus is removed can be calculated precisely.

5.3. Third Modified Embodiment

A third modified embodiment is next described. The method of aberration measurement associated with the above-described embodiment can increase the types of aberrations capable of being measured by increasing the number of illumination angles (the number of angular increments n), i.e., TEM images which are multiply exposed.

However, in the method of aberration measurement associated with the above-described embodiment, if the number of illumination angles (the number of angular increments n) is increased, the exposure time for each illumination angle is shortened, leading to a decrease in the S/N. Therefore, in order to improve the S/N, it is necessary to prolong the exposure time for each illumination angle.

For example, by reducing the number of increments n of the illumination angle when the illumination angle is scanned, the exposure time for each illumination angle can be prolonged. The decrease in the number of angular increments n of the illumination angle is compensated for by acquiring a plurality of multiple exposure images I2. Aberrations are calculated by calculating a correlation function of each of the multiple exposure images I2 with respect to the reference image I1 and combining the peaks of the resulting correlation functions.

Figure 12:
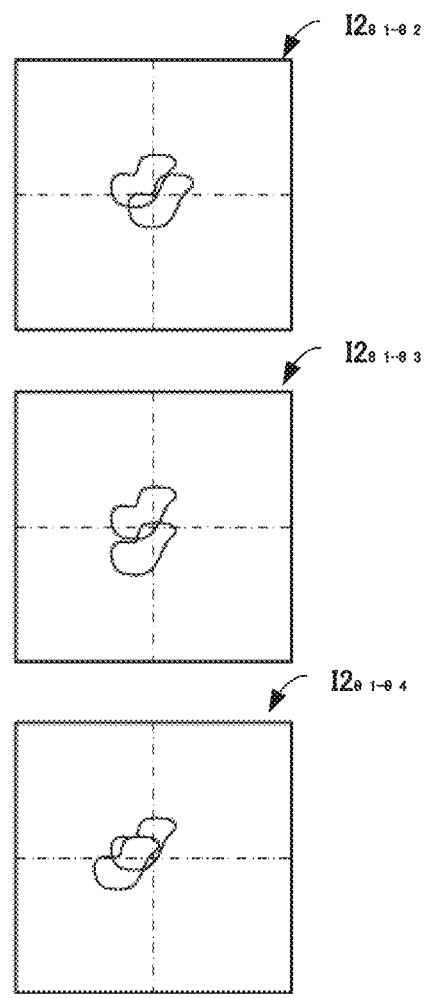
FIG. 12 shows pictorial representations of multiple exposure images obtained from combinations of different illumination angles.

For example, assume a case where there are four illumination angles (the number of angular increments n is four). First, the illumination angle of the electron beam is set to the first illumination angle $\theta_1$. Then, the angle is varied to the second illumination angle $\theta_2$. By repeating this process, a multiple exposure image $I2_{\theta_1-\theta_2}$ (see FIG. 12) is derived by multiple exposure of TEM images generated respectively at the first illumination angle $\theta_1$ and second illumination angle $\theta_2$.

Then, the illumination angle of the electron beam EB is set to the first illumination angle $\theta_1$. The angle is varied to the third illumination angle $\theta_3$. By repeating this process, a multiple exposure image $I2_{\theta_1-\theta_3}$ (see FIG. 12) is derived by multiple exposure of TEM images generated respectively at the first illumination angle $\theta_1$ and the third illumination angle $\theta_3$.

Then, the illumination angle of the electron beam EB is set to the first illumination angle $\theta_1$. The angle is varied to the fourth illumination angle $\theta_4$. By repeating this process, a multiple exposure image $I2_{\theta_1-\theta_4}$ (see FIG. 12) is derived by multiple exposure of TEM images generated respectively at the first illumination angle $\theta_1$ and fourth illumination angle $\theta_4$.

Then, a correlation function of the reference image I1 and the multiple exposure image $I2_{\theta_1-\theta_2}$ is calculated. Similarly, a correlation function of the reference image I1 and the multiple exposure image $I2_{\theta_1-\theta_3}$ is calculated. Furthermore, a correlation function of the reference image I1 and the multiple exposure image $I2_{\theta_1-\theta_4}$ is calculated. Aberrations are calculated by combining the positions of peaks of the three correlation functions obtained in this way.

As a result, the number of peaks contained in one correlation function can be reduced. Thus, it is easy to detect peaks. Also, the effects of noise can be reduced. Furthermore, because the obtained three correlation functions contain peaks corresponding to the common first illumination angle $\theta_1$, the effects of image drift that would normally be caused by acquiring plural multiple exposure images can also be reduced.

Figure 13:
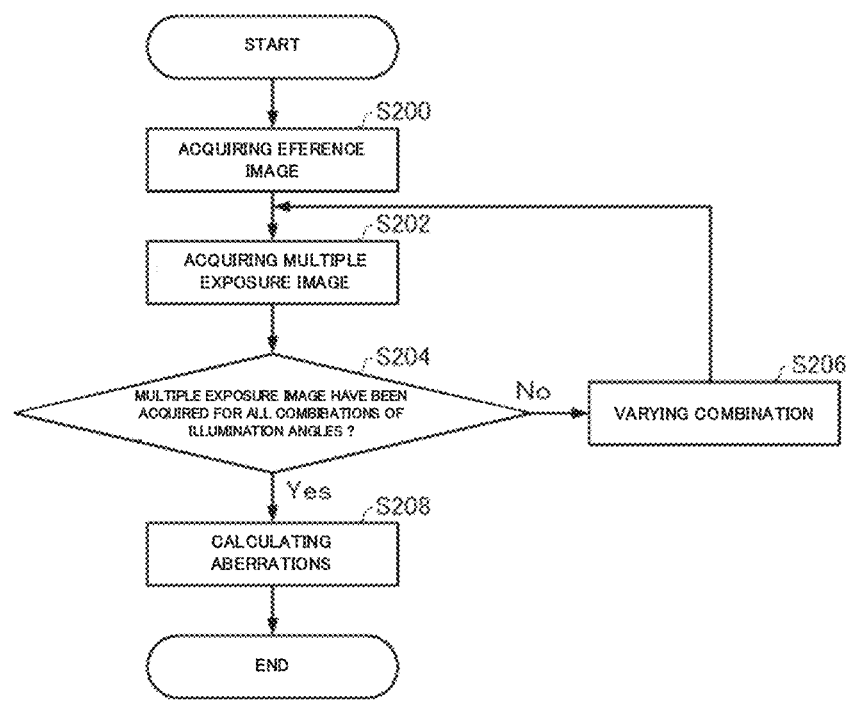
FIG. 13 is a flowchart illustrating one example of method of aberration measurement associated with a third modified embodiment.
Figure 14:
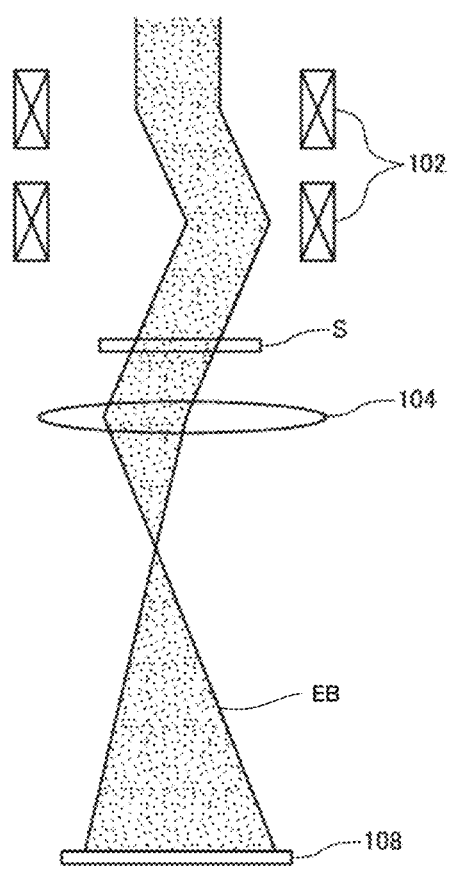
FIGS. 14-16 are electron ray diagrams schematically illustrating the prior art method of aberration measurement.
Figure 15:
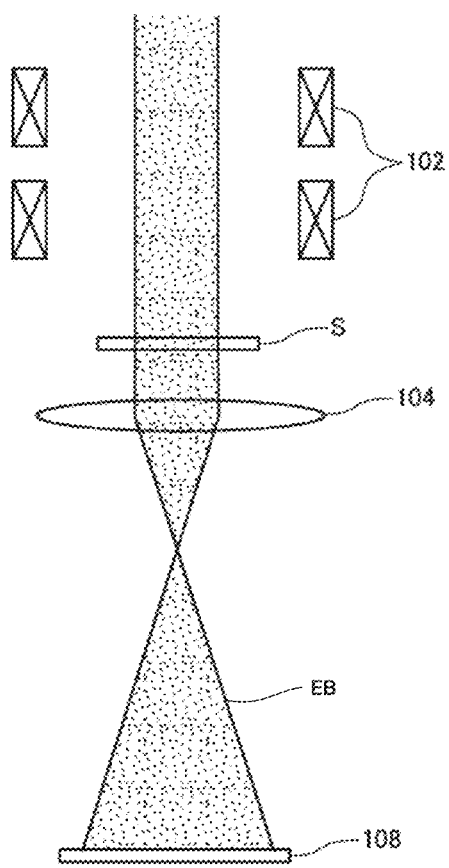
Figure 16:
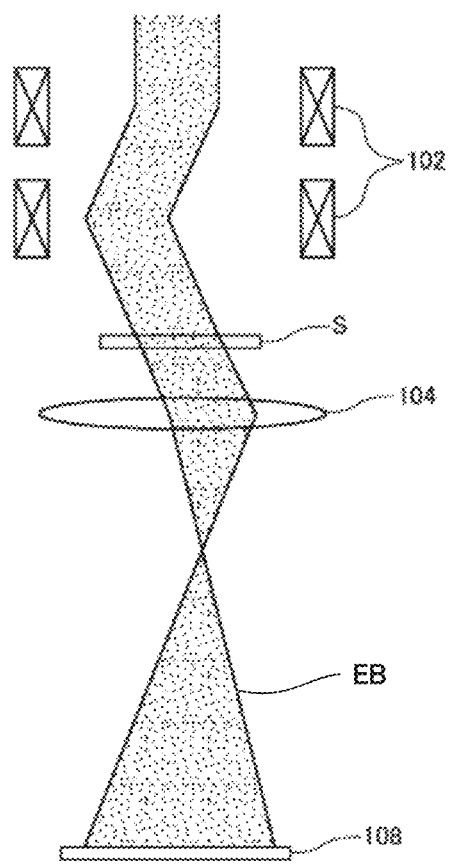
Figure 17:
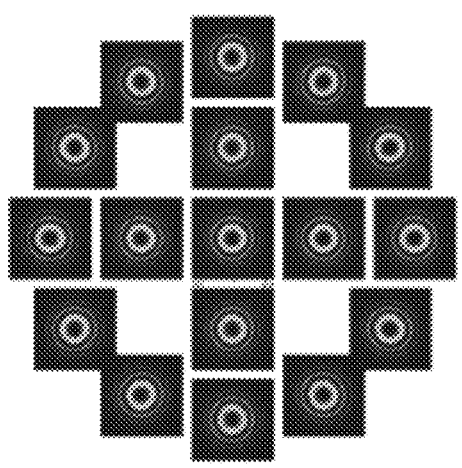
FIG. 17 shows a diffractogram tableau.
Figure 18:
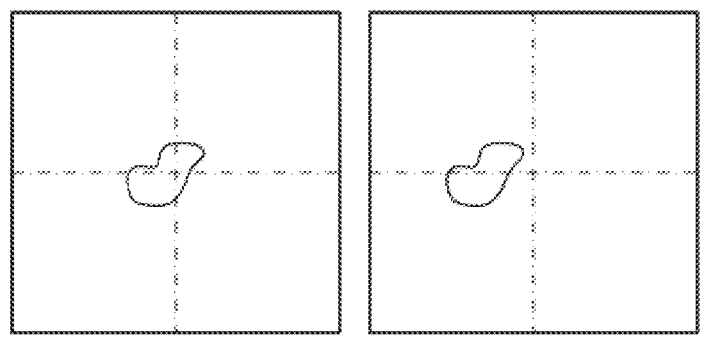
FIG. 18 shows pictorial representations illustrating an example in which aberrations are measured using image shifting.

FIG. 13 is a flowchart illustrating one example of the method of aberration measurement associated with a third modified embodiment. First, the reference image I1 is acquired (S200). The acquisition of the reference image I1 is carried out similarly to the step (S100) of acquiring the reference image I1 as already described in connection with FIG. 2.

Then, the multiple exposure image I2 is acquired (S202). Where the illumination angle is set to the range from the first illumination angle $\theta_1$ to the fourth illumination angle $\theta_4$, the illumination angle of the electron beam EB is first varied from the first illumination angle $\theta_1$ to the second illumination angle $\theta_2$. The process is repeated to thereby acquire the multiple exposure image $I2_{\theta_1-\theta_2}$.

Then, a decision is made as to whether multiple exposure images have been acquired for all the combinations of from the first illumination angle $\theta_1$ to the fourth illumination angle $\theta_4$ (S204).

If the decision at step S204 is No, indicating that multiple exposure images for all the combinations have not been acquired, the combination of used illumination angles is varied (S206) and the multiple exposure image I2 is again acquired (S202). For example, the combination of illumination angles is varied from the combination of the first illumination angle $\theta_1$ and the second illumination angle $\theta_2$ to the combination of the first illumination angle $\theta_1$ and the third illumination angle $\theta_3$, and the illumination angle of the electron beam EB is varied from the first illumination angle $\theta_1$ to the third illumination angle $\theta_3$, and the process is repeated. Thus, the multiple exposure image $I2_{\theta_1-\theta_3}$ is acquired.

The step (S206) of varying the combination of illumination angles and the step (S202) of acquiring a multiple exposure image are repetitively carried out until multiple exposure images are acquired for all combinations of illumination angles.

If the decision at step S204 is Yes, indicating that multiple exposure images have been acquired for all combinations of illumination angles, aberrations are calculated both from the reference image I1 and from plural multiple exposure images I2 (S208). Because of the processing steps described so far, aberrations can be measured.

The above-described aberration measurement may be effected by the aberration measuring section 44 or by the user who operates the electron microscope 100 through the manual control unit 50.

In the third modified embodiment, the step of acquiring the multiple exposure image I2 is carried out a plurality of times while varying the combination of different values of the scanned illumination angle to thereby acquire a plurality of multiple exposure images. During the step of calculating aberrations, a correlation function of each of plural multiple exposure images I2 and the reference image I1 is calculated, and aberrations are measured from the calculated correlation functions. Therefore, according to the third modified embodiment, the number of peaks contained in one correlation function can be reduced. Thus, the peaks can be detected easily. Furthermore, the exposure time for each illumination angle can be prolonged. In addition, according to the third modified embodiment, the effects of image drift during aberration measurement can be reduced in the same way as in the above-described embodiment. Aberrations can be measured with high accuracy.

It is to be noted that the foregoing embodiments and modified embodiments are merely exemplary of the invention and that the invention is not restricted to them. For example, the various embodiments and modified embodiments can be combined appropriately.

The present invention embraces configurations (e.g., configurations identical in function, method, and results or identical in purpose and advantageous effects) which are substantially identical to the configurations described in any one of the above embodiments. Furthermore, the invention embraces configurations which are similar to the configurations described in any one of the above embodiments except that their nonessential portions have been replaced. Additionally, the invention embraces configurations which are identical in advantageous effects to, or which can achieve the same object as, the configurations described in any one of the above embodiments. Further, the invention embraces configurations which are similar to the configurations described in any one of the above embodiments except that a well-known technique is added.

The invention claimed is:

1. A method of measuring aberrations in an electron microscope, comprising the steps of:
   acquiring a first image that is a transmission electron microscope (TEM) image of a sample;
   scanning the illumination angle of an electron beam impinging on the sample to generate a plurality of TEM images at different values of the illumination angle and acquiring a second image by multiple exposure of the TEM images, where the plurality of TEM images generated at different values of the illumination angle are overlapped to form the second image; and calculating aberrations from the first and second images.

2. A method of measuring aberrations as set forth in claim 1, wherein during the step of acquiring said second image, the illumination angle is scanned using deflectors incorporated in an illumination system of said electron microscope.

3. A method of measuring aberrations as set forth in claim 1, wherein during the step of acquiring said second image, the illumination angle of the electron beam impinging on said sample is scanned from a first illumination angle to an nth illumination angle (where n is an integer equal to or greater than 2) repeatedly and plural TEM images are subjected to a multiple exposure process.

4. A method of measuring aberrations as set forth in claim 1, wherein during the step of calculating said aberrations, a correlation function is calculated both from said first image and from said second image, and said aberrations are found from the positions of plural peaks appearing in the calculated correlation function.

5. A method of measuring aberrations as set forth in claim 1, wherein the step of acquiring said second image is carried out a plurality of times while varying an amount of defocus to thereby acquire a plurality of said second images, and wherein during the step of calculating said aberrations, correlation functions of a respective one of said second images and said first image are calculated, and illumination angles corresponding to their respective peaks are found from the calculated correlation functions.

6. A method of measuring aberrations as set forth in claim 1, wherein the step of acquiring said second image is carried out a plurality of times while varying the combination of different values of the scanned illumination angle to thereby acquire a plurality of said second images, and wherein during the step of calculating said aberrations, correlation functions of a respective one of the second images and said first image are calculated, and the aberrations are found from the calculated correlation functions.

7. An electron microscope comprising:

an electron source for emitting an electron beam;

an illumination system including deflectors for deflecting the emitted electron beam;

an imaging system for generating a focused transmission electron microscope (TEM) image from electrons transmitted through a sample;

an imager for capturing the TEM image generated by the imaging system; and an aberration measuring section for measuring aberrations in the imaging system;

wherein said aberration measuring section performs the steps of:

acquiring a first image that is a TEM image of the sample;

controlling the deflectors to scan the illumination angle of the electron beam impinging on the sample such that a second image is acquired by multiple exposure of a plurality of TEM images generated at different values of the illumination angle, where the plurality of TEM images generated at different values of the illumination angle are overlapped to form the second image; and calculating the aberrations from the first and second images.

* * * * *